US010079410B2

(12) United States Patent
Lee et al.

(10) Patent No.: US 10,079,410 B2
(45) Date of Patent: Sep. 18, 2018

(54) METHODS FOR DENDRITE DETECTION AND DEVICES FOR BATTERIES AND DENDRITE SENSORS

(71) Applicant: Lockheed Martin Corporation, Bethesda, MD (US)

(72) Inventors: James L. Lee, Elbert, CO (US); Edward Henry Allen, Bethesda, MD (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 552 days.

(21) Appl. No.: 14/520,181

(22) Filed: Oct. 21, 2014

(65) Prior Publication Data

US 2015/0056484 A1    Feb. 26, 2015

Related U.S. Application Data

(63) Continuation-in-part of application No. 14/469,441, filed on Aug. 26, 2014.

(60) Provisional application No. 61/870,133, filed on Aug. 26, 2013.

(51) Int. Cl.
*H01M 10/48* (2006.01)
*G01R 31/36* (2006.01)
*H01M 10/0525* (2010.01)

(52) U.S. Cl.
CPC ....... *H01M 10/48* (2013.01); *H01M 10/0525* (2013.01); *G01R 31/3679* (2013.01)

(58) Field of Classification Search
None
See application file for complete search history.

(56) References Cited

U.S. PATENT DOCUMENTS

| 2007/0018141 A1 | 1/2007 | Kepler et al. |
| 2009/0111025 A1* | 4/2009 | Lee ............. H01M 2/166 429/251 |
| 2009/0261835 A1 | 10/2009 | Iwanaga et al. |
| 2011/0254117 A1 | 10/2011 | Kozicki |

(Continued)

OTHER PUBLICATIONS

Ramadan, et al., "A review of piezoelectric polymers as functional materials for electromechancial transducers," Jan. 17, 2014, Smart Materials and Structures, vol. 23, 26 pages.

(Continued)

*Primary Examiner* — Jonathan Crepeau
(74) *Attorney, Agent, or Firm* — McDermott Will & Emery LLP (57) ABSTRACT

An electrical device is provided. The electrical device includes a pulse generator configured to generate a first pulse. The electrical device also includes a battery. The battery includes a first conductive electrode configured to receive the first pulse from the pulse generator, a second conductive electrode coupled to the first conductive electrode, and a dielectric separator element coupled to the first conductive electrode and the second conductive electrode and configured to provide a second pulse. The second pulse is based on the first pulse and based on the electrical properties of the dielectric separator element. The electrical device also includes a controller coupled to the pulse generator and the dielectric separator element. The controller is configured to compare the first pulse with the second pulse.

13 Claims, 4 Drawing Sheets

(56) References Cited

U.S. PATENT DOCUMENTS

2013/0130125 A1    5/2013  Hauser
2013/0162258 A1*   6/2013  Patin .................. G01R 31/3606
                                                            324/427
2015/0155605 A1    6/2015  Dvorsky et al.

OTHER PUBLICATIONS

"Technologies—Electro-Optic and Magneto-Optic Detection," Advanced Fiber Sensors Inc, avaiable Mar. 2, 2011, retrieved on Sep. 28, 2017 from http://www.fiber-sensors.com/tehnologies/electro-optic-magneto-optic-detection, 1 page.

* cited by examiner

METHODS FOR DENDRITE DETECTION AND DEVICES FOR BATTERIES AND DENDRITE SENSORS

CROSS-REFERENCE TO RELATED APPLICATIONS

This application is a continuation-in-part of U.S. patent application Ser. No. 14/469,441, filed Aug. 26, 2014, which claims the benefit of priority under 35 U.S.C. § 119 from U.S. Provisional Patent Application No. 61/870,133, filed Aug. 26, 2013, each of which is incorporated herein by reference in its entirety.

STATEMENT REGARDING FEDERALLY SPONSORED RESEARCH OR DEVELOPMENT

Not applicable.

FIELD

The present disclosure generally relates to batteries, and, more specifically, to systems and methods for determining the presence of metallic dendrites in batteries.

BACKGROUND

Typical lithium-ion batteries utilize carbon anodes and lithiated transition metal oxide cathodes separated by an ion-permeable separator material. Higher charge density can be attained by utilizing porous silicon anode in place of carbon. These types of batteries currently dominate the battery market in the area of cellular phones, cameras, computers, and other electronic equipment. Problematic areas for these batteries, particularly in rugged applications, include safety, life span, and cost.

One source of failure in lithium-ion batteries involves the formation of dendrites within the battery. Dendrites are elongated, microscopic metal deposits that can form within the cell. Known causes of dendrite formation include manufacturing defects, over charging, and rapid charge at cold temperatures. Dendrite formation generally begins in the anode and creates an internal short once dendrites extend through the separator material to the cathode. Overcharging and overly rapid charging are believed to build up excessive concentrations of lithium ions in the electrolyte near the electrodes before the lithium ions can be conveyed to the opposite electrode, thereby forming a dendrite upon exceeding the solubility limit. Shorts caused by dendrites can lead to a catastrophic battery failure. Although the cause of recent Boeing 787 fires has not yet been determined, there has been some speculation that they resulted from dendrites. There is currently no method to reliably detect the presence of dendrites within a battery.

In view of the foregoing, batteries incorporating dendrite detection technology and methods for detecting dendrites would represent a substantial advance in the art. The present disclosure satisfies these needs and provides related advantages as well.

SUMMARY

In some implementations, the present disclosure describes batteries containing an electric field sensor configured to detect an electric field in their separator material. In some implementations, the batteries include a cathode and an anode having a separator material disposed therebetween, and a plurality of electric field sensors configured to detect an electric field in the separator material.

In some implementations, the present disclosure describes methods for sensing dendrites using electric field detection and monitoring the changes thereof. In some embodiments, the methods include providing a battery having a cathode, an anode, and a separator material disposed therebetween, contacting a plurality of electric field sensors within the separator material, and measuring an electric field in the battery using such electric field sensors.

In some implementations, the present disclosure describes an electrical device. The electrical device includes a pulse generator configured to generate a first pulse. The electrical device also includes a battery. The battery includes a first conductive electrode configured to receive the first pulse from the pulse generator, a second conductive electrode coupled to the first conductive electrode, and a dielectric separator element coupled to the first conductive electrode and the second conductive electrode and configured to provide a second pulse. The second pulse is based on the first pulse and based on electrical properties of the dielectric separator element. The electrical device also includes a controller coupled to the pulse generator and the dielectric separator element. The controller is configured to compare the first pulse with the second pulse. In one or more aspects, the dielectric separator element is a non-conductive piezoelectric separator element.

In some implementations, the present disclosure describes a method. The method includes providing a battery comprising a first electrode, a second electrode, and a piezoelectric reactance separator element. The method also includes applying a first pulse to the first electrode. The method also includes generating a second pulse, where the second pulse is based on the first pulse and based on electrical properties of the piezoelectric reactance separator element. The method also includes detecting the second pulse. The method also includes comparing the first pulse with the second pulse from the piezoelectric reactance separator element. In one or more aspects, the piezoelectric reactance separator element is non-conductive.

It is to be understood that both the foregoing general description and the following detailed description are exemplary and explanatory and are intended to provide further explanation of the subject technology as claimed. It is also to be understood that other aspects may be utilized and changes may be made without departing from the scope of the subject technology.

BRIEF DESCRIPTION OF THE DRAWINGS

The accompanying drawings, which are included to provide further understanding and are incorporated in and constitute a part of this specification, illustrate disclosed embodiments and together with the description serve to explain the principles of the disclosed embodiments. In the drawings.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology.

The present disclosure is directed, in part, to batteries configured for sensing an electric field or changes thereto in their separator material. The present disclosure is also directed, in part, to methods for sensing the formation of dendrites in a battery by detecting and monitoring an electric field therein over time.

Some present approaches that have been pursued for identifying the presence of dendrites within a battery include optical sensors and optical fibers, external strain gauges, thin-film temperature sensing, gas monitoring, and laser-guided ultrasonic inspection. However, these approaches are still in a developmental stage and are complicated to implement.

The present inventors recognized that monitoring an electric field in a battery and its changes can represent a simplified and advantageous alternative to present approaches for monitoring the health of a lithium-ion battery. The presence of a metallic dendrite in a battery increases the electric field intensity near the tip of the dendrite. The present inventors recognized that by measuring the electric field intensity within a lithium-ion battery and the changes thereto, the growth and incursion of dendrites in the battery can be monitored. Techniques for monitoring a generated electric field in a battery can be much simpler to implement compared to existing techniques for assaying for metallic dendrites.

Specifically, the inventors recognized that electric field monitoring within or in proximity to the separator material of the battery can be beneficial. Until a dendrite has broken through the separator material, the dendrite cannot produce an internal short. By monitoring the electric field within the separator material, it can be determined whether dendrites have penetrated or are about to penetrate through the separator material and become harmful. Detecting the presence of dendrites in the separator material can allow a battery management system to shut down the cell before the dendrites reach the cathode and therefore can prevent a potentially catastrophic internal short. In addition to increasing battery safety, this approach may also provide insight into the state of health of the battery by monitoring the change in the cell operation over time.

Although any suitable technique can be used to monitor the electric field within or in proximity to the separator material, techniques based upon capacitance measurement can be particularly advantageous. Such techniques can be readily configured within existing battery designs and implemented relatively inexpensively. A number of capacitance measurement techniques, both those based upon bulk capacitance as well as those utilizing nanoscale capacitance measurement techniques, can be suitable for use in the embodiments of the present disclosure.

In some embodiments, batteries described herein include a cathode and an anode having a separator material disposed therebetween, and a plurality of electric field sensors configured to detect an electric field in the separator material.

In some embodiments, the electric field sensors are in contact with the separator material. In some embodiments, the electric field sensors are disposed on a surface of the separator material. In other embodiments, the electric field sensors are disposed within the separator material.

In some embodiments, the batteries of the present disclosure can also include a controller configured to monitor and regulate their operation. In some embodiments, the controller can be communicatively coupled to the electric field sensors. The communicative coupling can be a direct wired connection or a wireless connection. By being communicatively coupled to the electric field sensors, the controller can change an operational state of the battery upon detecting the presence of dendrites therein.

Figure 1:
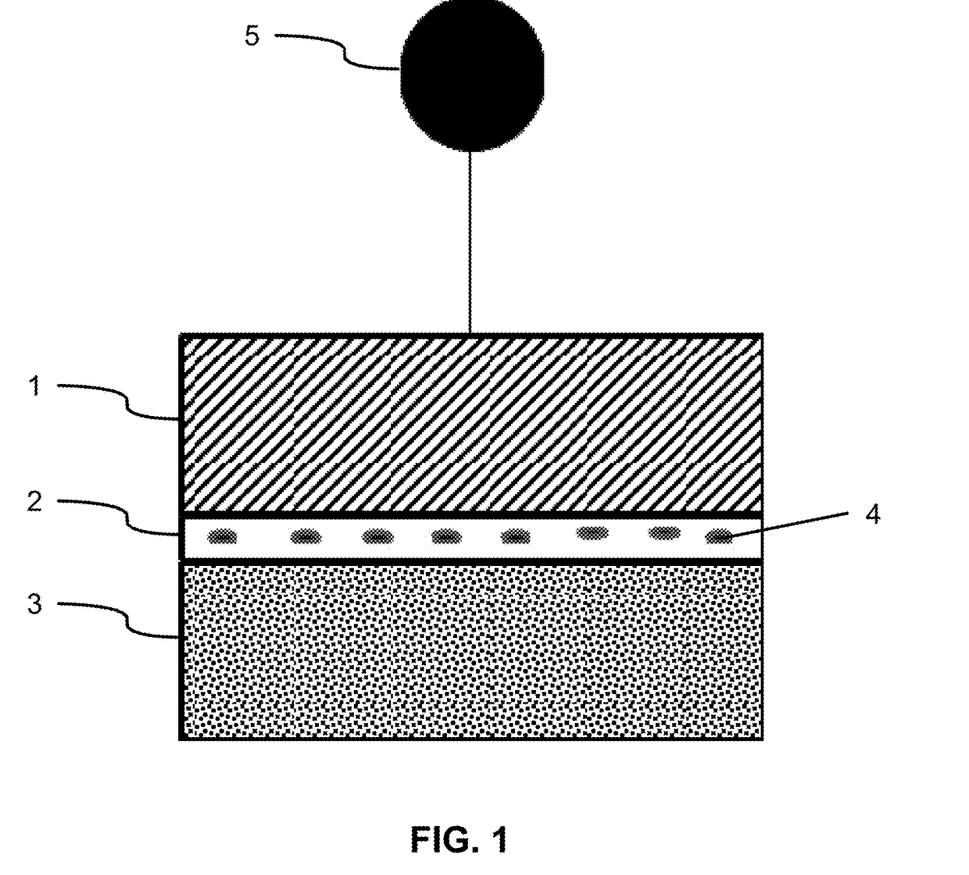
FIG. 1 shows a schematic of a battery containing an electric field sensor on or in the separator material, in accordance with one or more implementations.

FIG. 1 shows a schematic of a battery capable of sensing an electric field in its separator material, in accordance with one or more implementations. As shown in FIG. 1, cathode 1 and anode 3 are separated by separator material 2. Separator material 2 contains a plurality of electric field sensors 4 disposed on or in the separator material 2. Although FIG. 1 has depicted electric field sensors 4 as discrete entities, they can also be a continuous, monolithic sensor, if desired. Suitable electric field sensors are not believed to be particularly limited in function or structure, as long as they can be satisfactorily deployed on or in the separator material. The battery can also contain controller 5 to monitor and regulate the operation of the battery in the event that the occurrence of dendrites is detected.

In some embodiments, the battery can be a lithium-ion battery. The battery can contain a lithium salt electrolyte and a non-aqueous solvent, as conventionally used in lithium-ion batteries. Suitable lithium salts can include, for example, $LiClO_4$, $LiBF_4$, $LiAsF_6$, $LiPF_6$, $LiCF_3SO_3$, $Li(CF_3SO_2)_2N$, $Li(CF_3SO_2)_3C$, $LiN(SO_2C_2F_5)_2$, lithium alkyl fluorophosphates, lithium bis(oxalato)borate (LiBOB), and any combination thereof. Other lithium salt electrolytes can also be suitable for use in the batteries of the present disclosure and will be familiar to one having ordinary skill in the art.

Organic solvents used in non-aqueous electrolytes of the batteries are generally aprotic organic solvents having a high dielectric constant. Illustrative organic solvents that can be used in a non-aqueous electrolyte include, without limitation, alkyl carbonates (e.g., propylene carbonate, ethylene carbonate, butylene carbonate, dimethyl carbonate, diethyl carbonate, dipropyl carbonate, methyl ethyl carbonate, methyl butyl carbonate, methyl propyl carbonate, ethyl propyl carbonate, butyl propyl carbonate, 1,2-butylene carbonate, 2,3-butylene carbonate, 1,2-pentene carbonate, and 2,3-pentene carbonate), nitriles (e.g., acetonitrile, acrylonitrile, propionitrile, butyronitrile and benzonitrile), sulfoxides (e.g., dimethyl sulfoxide, diethyl sulfoxide, ethyl methyl sulfoxide, and benzylmethyl sulfoxide), amides (e.g., formamide, methylformamide, and dimethylformamide), pyrrolidones (e.g., N-methylpyrrolidone), lactones (e.g., γ-butyrolactone, γ-valerolactone, 2-methyl-γ-butyrolactone, and acetyl-γ-butyrolactone), phosphate triesters, nitromethane, ethers (e.g., 1,2-dimethoxyethane; 1,2-diethoxyethane; 1,2-methoxyethoxyethane; 1,2- or 1,3-dimethoxypropane; 1,2- or 1,3-diethoxypropane; 1,2- or 1,3-ethoxymethoxypropane; 1,2-dibutoxyethane; tetrahydrofuran; 2-methyltetrahydrofuran and other alkyl, dialkyl, alkoxy or dialkoxy tetrahydrofurans; 1,4-dioxane; 1,3-dioxolane; 1,4-dioxolane; 2-methyl-1,3-dioxolane; 4-methyl-1,3-dioxolane; sulfolane; 3-methylsulfolane; methyl ether; ethyl ether; propyl ether; diethylene glycol dialkyl ether; triethylene glycol dialkyl ethers; ethylene glycol dialkyl ethers; and tetraethylene glycol dialkyl ethers), esters (e.g., alkyl propionates such as methyl or ethyl propionate, dialkyl malonates such as diethyl malonate, alkyl acetates such as methyl acetate and ethyl acetate, and alkyl formates such as methyl formate and ethyl formate); and maleic anhydride.

The separator material is not believed to be particularly limited and can be formed from any porous dielectric material having a sufficient porosity to promote ion mobility between the cathode and the anode when the battery is charging or discharging. Choice of the separator material may be influenced to some extent by the chosen technique for monitoring the electric field in the separator material. In some embodiments, the separator material can include polymers such as polyethylene, polypropylene, polyester, and polyacrylonitrile. In some embodiments, the separator material can be a porous poly(vinylidene fluoride)-hexafluoropropane copolymer film, a porous cellulose film, kraft paper, rayon woven fabrics, and the like. In various embodiments, the thickness of the separator material can be about 100 microns or less. The electric field sensors can be deployed in the separator material during its formation or on the separator material during fabrication of the battery.

As indicated above, methods for sensing metallic dendrites include measuring an electric field in a battery and its changes over time. In some embodiments, measuring the electric field in a battery and its changes can involve measuring the capacitance in proximity to or within the separator material of the battery. A number of techniques can be suitable for monitoring the capacitance within the battery, as discussed hereinafter.

In some embodiments, methods described herein include providing a battery having a cathode, an anode, and a separator material disposed therebetween, contacting a plurality of electric field sensors with the separator material, and measuring an electric field in the battery using the electric field sensors. In various embodiments, the electric field is measured in the separator material. In more particular embodiments, measuring the electric field in the battery can involve measuring the capacitance within the battery (at the separator material).

In various embodiments, measuring the electric field can involve determining a change in the electric field as a function of time. The change in the electric field as a function of time can be correlated to an incursion of one or more metallic dendrites into the separator material. In some embodiments, the electric field can be monitored continuously in order to determine the incursion of metallic dendrites into the separator material. In other embodiments, the electric field can be monitored non-continuously, since the growth of dendrites is typically slow and occurs over time. The periods between measurements of the electric field for non-continuous monitoring can range between about every 10 minutes and about every 24 hours. A suitable monitoring period can depend upon the application in which the battery is being used and its rate and frequency of charge and discharge.

In some embodiments, the methods described herein can further include regulating an operational state of the battery upon the incursion of one or more metallic dendrites into the separator material. Regulation of the operational state of the battery can take place using the controller described above. In some embodiments, regulation of the operational state of the battery can involve breaking circuit containing the battery upon the detection of changes in the electric field, stopping the charging or discharging of the battery upon the detection of changes in the electric field, changing the rate of charging or discharging upon the detection of changes in the electric field, or any combination thereof.

Figure 2:
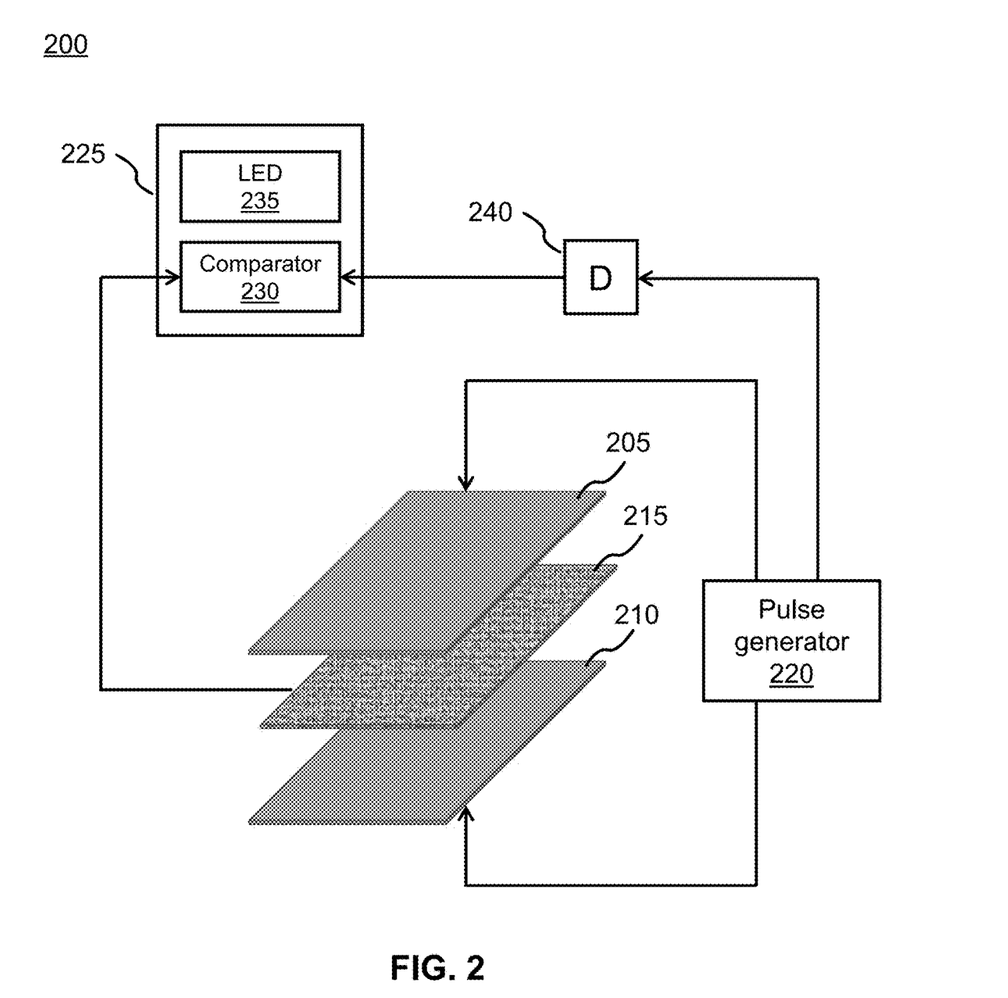
FIG. 2 shows a schematic of an electrical device, in accordance with one or more implementations.

FIG. 2 shows a schematic of an electrical device 200, in accordance with one or more implementations. The electrical device 200 includes a battery, where the battery includes a first electrode 205, a second electrode 210, and a piezoelectric separator element 215 disposed between the first electrode 205 and the second electrode 210. The first electrode 205 may be an anode and the second electrode 210 may be a cathode, or vice versa.

The electrical device 200 also includes a pulse generator 220 and a controller 225. The pulse generator 220 is configured to generate an input pulse. A pulse received at (e.g., applied to) the battery electrodes 205 and 210 and the controller 225 is based on, or is, the input pulse. The controller 225 is coupled to the pulse generator 220. The controller 225 is also coupled to the piezoelectric separator element 215 via the battery electrodes 205 and 210 (as explained in more detail below). The controller 225 is configured to compare the input pulse with an output pulse provided by the piezoelectric separator element 215.

In one or more implementations, a pulse may be injected in a first axis of a piezoelectric separator element 215 and a pulse may be withdrawn from the piezoelectric separator element in a second axis of the piezoelectric separator element 215. In some aspects, the piezoelectric separator element 215 is in contact with one or both of the battery electrodes 205 and 210. In some aspects, the piezoelectric separator element 215 may be a layer of piezoelectric material. For example, poly(vinylidene fluoride) may be manufactured in such a manner that it exhibits piezoelectric properties. In other aspects, the piezoelectric separator element 215 may be a material that includes piezoelectric threads woven in a material such as a polyethylene, porous cellulose film, and so forth. For example, every other thread of a woven material may be a piezoelectric thread. In some aspects, more than one piezoelectric separator element may be included in a battery.

In one or more implementations, the piezoelectric separator element 215 may include a piezoelectric transformer. The piezoelectric transformer is a four wire device that may allow for injecting of a test pulse and extracting of a test result. For example, the piezoelectric transformer may be a piezoelectric crystal of a cubic shape. The cube has six sides, which provides three axes: a first axis for an input field, a second axis for an output field, and a third axis for mechanical storage of a stress field.

Other structures for the piezoelectric separator element 215 are possible and may be selected/constructed based on performance considerations, cost considerations, and so forth. Additional examples of the piezoelectric separator element 215 and properties thereof are described by K. Ramadan et al. in "*A review of piezoelectric polymers as functional materials for electromechanical transducers,*" Smart Mater. Struct., Vol. 23, January 2014, pp. 1-26, which is hereby incorporated by reference in its entirety.

The controller 225 includes a pulse comparator circuit 230 and a light emitting diode (LED) 235. The pulse comparator circuit 230 may compare pulses (e.g., compare an input pulse with an output pulse). The pulse comparator circuit 230 may detect a difference between the pulses to determine, for example, whether the pulses cancel one another and/or to what degree the pulses do not cancel one another (e.g., the pulses are different). The LED 235 may be configured to provide a visual indication (e.g., to a user of the battery) regarding a result of comparing the input pulse with the output pulse. In one or more implementations, the LED 235 may be another type of output device (e.g., a visual output device, a sound output device, or a combination). In some aspects, a single LED may be utilized as both the pulse comparator circuit 230 and the LED 235. For example, a difference between the pulses that is greater than a threshold voltage of a single LED may cause the LED to provide a visual indication (e.g., light up) that an anomaly is detected in the battery.

In one or more implementations, the comparator circuit 230 comprises an adder circuit or a superposition circuit. In one or more implementations, the comparator circuit 230 comprises other processing circuits to correlate the results of the comparison and to regulate the operation of the battery. In one or more implementations, components of the comparator circuit 230 may be implemented in hardware, software, or a combination of both.

In some aspects, the electrical device 200 may include a delay component 240. The delay component 240 may be utilized to account for a time delay between the input pulse and the output pulse that is determined by the time constant of the piezoelectric separator element 215. The delay component 240 may include, or may be, a delay line. Alternatively or in addition, the delay component 240 may store a copy of an input pulse from the pulse generator 220 and may provide the copy of the input pulse to the controller 225 to allow for comparison of the copy of the input pulse with the output pulse by the controller 225.

The pulse generator 220 and the controller 225 may be referred to as a testing device. The testing device may be connected to the battery throughout a lifetime of the battery. The battery electrodes 205 and 210 may be utilized as input and output lines for making testing measurements.

In some aspects, the testing device may be energized/operated periodically, such as every few hours, every other day, and so forth. Frequency of energizing/operating the testing device may depend on application. The controller 225 may record data (e.g., difference between input and output pulse) associated with the battery on a memory device (not shown) within or otherwise accessible to the controller 225. A difference between the input and output pulse may become more apparent (e.g., larger) over time, indicating that the battery may need to be replaced. In some aspects, a threshold voltage or power level of the battery may be set by the controller 225 such that once the threshold level is reached or exceeded, the controller 225 may automatically turn off operation of the battery. The LED 235 may be utilized to provide a visual indication (e.g., to a user of the battery) that further use of the battery might not be safe.

The pulse generator 220 may be configured to apply a pulse across the battery electrodes 205 and 210. In one or more implementations, the pulse generator 220 may be an on/off switch. In one or more implementations, the pulse may be a sudden steep and ultra-short pulse. The pulse may be applied against the polarity of the battery electrodes 205 and 210 (e.g., applied in an adverse polarization sense). Application of the pulse causes an adverse electric field to be imposed on the piezoelectric separator element 215, which, in response to the imposed electric field, deforms mechanically. The mechanical deformation (e.g., changes in shape and/or size) stores the energy of the pulse. Such a pulse may be referred to as a charging pulse. When the pulse ends, the piezoelectric separator element 215 relaxes and generates a pulse of reverse polarity that travels through the battery electrodes 205 and 210 in a forward direction and is thus detectable at battery electrodes 205 and 210 or battery wires. The pulse generated by the piezoelectric separator element 215 may be referred to as a discharging pulse, and may be provided to the controller 225. In some aspects, the detection of dendrites may be based on comparing the charging pulse and the discharging pulse and detecting a difference between the two pulses. For example, the comparison may include comparing the shapes, slopes, and/or energy contents of the two pulses by subtracting or adding the two pulses. In one or more aspects, an input pulse may be the charging pulse. In one or more aspects, an output pulse may be the discharging pulse.

In one or more implementations, the charging pulse applied to the battery electrodes 205 and 210 may be a short pulse. The short pulse may be a microsecond pulse or a nanosecond pulse (e.g., gigahertz pulse). Since the charging pulse may appear on a load of the battery as a sudden spike of current, a shorter pulse, which is a faster, higher frequency pulse, is farther away from direct current (DC) and reduces the effect of the charging pulse on operation of the DC circuit formed by the load and the battery.

In one or more implementations, resonant frequency of the piezoelectric separator element 215 may be selected to be high (e.g., far from DC) so as to reduce effect of DC operation of the battery due to AC activity of the battery. AC activity may include measurements associated with the charging pulse and discharging pulse. The resonant frequency of the piezoelectric separator element 215 is a function of dimensions of the piezoelectric separator element 215. In some aspects, the piezoelectric separator element 215 may be a layer of material, and the resonant frequency of the piezoelectric separator element 215 is a function of thickness of the piezoelectric separator element 215. Thinner material is associated with a higher resonant frequency of the piezoelectric separator element 215. The resonant frequency of the piezoelectric separator element 215 is also a function of a piezoelectric modulus of the piezoelectric separator element 215.

Other ways by which to reduce the effect on the DC operation of the battery are possible. For example, the effect on the DC operation of the battery due to measurements associated with the charging pulse and discharging pulse may be reduced by applying the pulse against the polarity of the battery, which may increase a permittivity of the electrolyte. As another example, the effect on the DC operation of the battery may be reduced by applying a single pulse, keeping the measurement cycle within a fraction of the natural frequency (e.g., resonant frequency) of the battery when considered as a capacitor. The controller 225 may be configured to monitor an input pulse during a measurement cycle and monitor an output pulse during the measurement cycle, where the measurement cycle is a fraction of (or less than) a resonant frequency of the battery.

In one or more implementations, the electrical device 200 may be utilized for detection of dendrites. In some aspects, determining whether dendrites have formed in a battery and to what degree the dendrites have formed may be based on the measurements associated with the charging pulse and discharging pulse. As dendrites grow, the capacitance of the battery electrodes 205 and 210 changes. The dendrites also mechanically limit an extent to which the piezoelectric separator element 215 can store stress energy, and cause the mechanical reactance of the piezoelectric separator element 215 to change. Due to the capacitance and mechanical reactance changes, a resonant frequency of the battery formed by the battery electrodes and the piezoelectric separator element 215 shifts relative to a resonant frequency of the battery without dendrites. The capacitance and mechanical reactance changes may have an additive effect with respect to shifting the resonant frequency of the battery.

As indicated above, the shift in resonant frequency may be determined by comparing an input pulse with an output pulse, e.g., superpositioning an input pulse (or a delayed version of an input pulse) with an output pulse and detecting any difference between the input pulse and the output pulse. In some aspects, a shape, a slope, or an energy content of the input pulse may be compared with a shape, a slope, or an energy content of the output pulse. In some aspects, the difference may be based on a difference between total energy of the input and output pulses. In some aspects, the difference in magnitude between the input pulse and the output pulse and/or the difference in the slope (the rate of change of the magnitude) between the two pulses may be utilized to estimate a remaining life of the battery.

Figure 3:
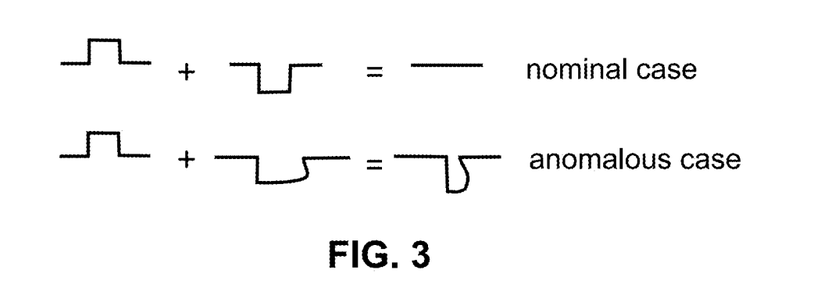
FIG. 3 shows results of adding pulses for a nominal case and an anomalous case, in accordance with one or more implementations.

FIG. 3 shows results of adding pulses for a nominal case and an anomalous case, in accordance with one or more implementations. In the nominal case, the input pulse and the output pulse cancel one another, which may indicate that no dendrite has formed in the battery. In the anomalous case, the input pulse and the output pulse do not cancel one another, and the degree to which the input pulse and the output pulse differ from each other may provide an indication as to the degree of dendrite growth in the battery. For example, in a case where a pulse comparator circuit (e.g., 230 in FIG. 2) is an LED, the pulse comparator circuit has a cutoff energy (e.g., based on a threshold voltage of the LED), which may be utilized to trigger detection of the anomalous case. Other thresholds for triggering detection of the nominal case or the anomalous case may be utilized.

Figure 4:
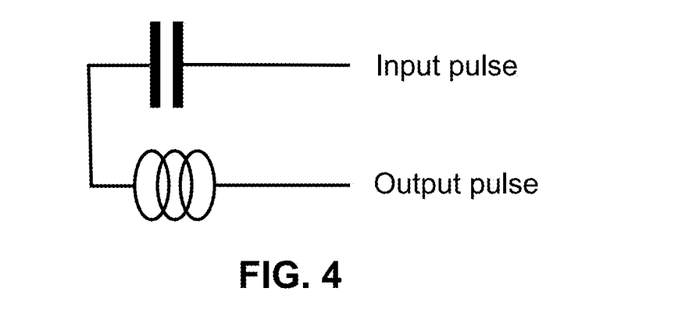
FIG. 4 shows a tank circuit that can be utilized to model the battery shown in FIG. 2, in accordance with one or more implementations.

FIG. 4 shows a tank circuit that can be utilized to model the battery shown in FIG. 2, in accordance with one or more implementations. The tank circuit includes a capacitive reactance from the battery electrodes 205 and 210 and a mechanical reactance from the piezoelectric separator element 215. The battery electrodes 205 and 210 may form the plates of a capacitor in the tank circuit. An input pulse is applied to the battery electrodes 205 and 210 and an output pulse is extracted from the piezoelectric separator element 215. The resonant frequency of the tank circuit can be provided by $$f = \frac{1}{\sqrt{LC}}$$

where C is the capacitive reactance and L is the mechanical reactance.

Operation of the tank circuit at resonant frequency is provided as follows. Electrical energy flows into the capacitor of the tank circuit and is stored in the electric field between the capacitor. When a full charge of energy is stored, the electric field discharges its energy into the piezoelectric separator element 215, which stores the energy as mechanical energy (e.g., mechanical strain). After all the mechanical energy is thus stored, the piezoelectric separator element 215 relaxes, discharging the mechanical charge back to the capacitor. Assuming no losses, energy in the tank circuit may be continually passed back and forth using electric fields and mechanical strain.

In one or more aspects, the electrodes 205 and 210 of the battery serve as both the plates of the capacitor in the tank circuit and the electrodes of the piezoelectric separator element 215. In addition, the electrodes 205 and 210 may serve as the input and output lines for the measuring system (e.g., input lines coupled to the pulse generator 220, and output lines coupled to the controller 225).

The tank circuit may be utilized for measuring small changes in the capacitive reactance formed by the electrodes of a battery and in the mechanical reactance of the piezoelectric separator element, which has less energy storage capability in the presence of dendrites, in order to detect changes in an average spacing between the electrodes that may result from presence of one or more dendrites growing between the electrodes. Thus, dendrite growth changes the balance between the capacitive and mechanical reactances so as to amplify the effect when operated as a tank circuit.

LC circuits are often used as filters. The L/C ratio is one of the factors that determine the quality factor Q of the circuits, which is a measure of selectivity. For a series resonant circuit with a given resistance, the higher the inductance and the lower the capacitance, the narrower the filter bandwidth. For a parallel resonant circuit the opposite applies. Positive feedback around the tuned circuit ("regeneration") can also increase selectivity. The higher the selectivity of the circuit, the more sensitive the resonance frequency is to the presence of dendrites (which cause changes to the resonance frequency). Changing out the inductive portion of the circuit for a piezoelectric device can greatly enhance the Q and thus the sensitivity to capacitive changes due to dendrites. In one or more implementations, a very high, near-infinite Q is desired so that the birth and growth of a single dendrite becomes immediately evident by perceptible shift in the resonant frequency.

Figure 5:
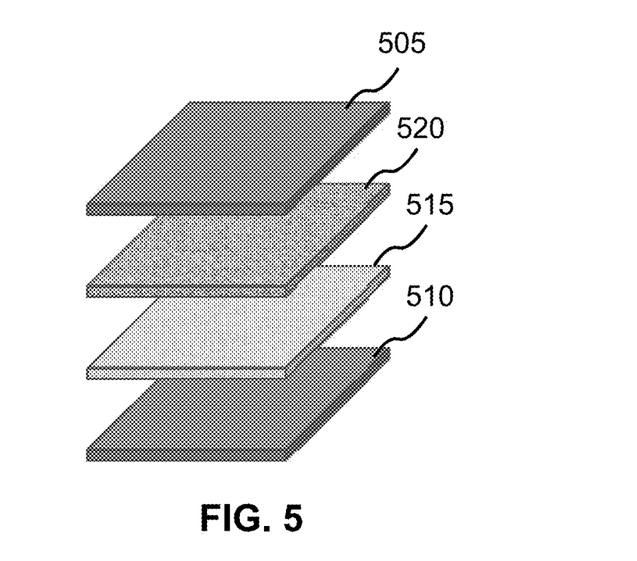
FIG. 5 shows an example of a battery, in accordance with one or more implementations.

FIG. 5 shows an example of a battery 500, in accordance with one or more implementations. The battery 500 may be utilized in the electrical device 200 shown in FIG. 2. The battery 500 includes a first electrode 505, a second electrode 510, a piezoelectric separator element 515, and one or more bulking separator elements 520. The inclusion of bulking materials is optional and allows the separation distance between the electrodes of the capacitive reactance to be optimized separately from the thickness of the piezoelectric (e.g., mechanical) reactance. The piezoelectric separator element 515 and the one or more bulking separator elements 520 are disposed between the first electrode 505 and the second electrode 510. The one or more bulking separator elements 520 may be utilized so that a separation between the first electrode 505 and the second electrode 510 is sufficient not to create an intrinsic short in the battery. Each of the bulking separator elements 520 may be disposed above or below the piezoelectric separator element 515. In some aspects (not shown), the bulking separator elements 520 may be interspersed such that some bulking separator elements 520 are disposed above the piezoelectric separator element 515 and some are disposed below the piezoelectric separator element 515.

Figure 6:
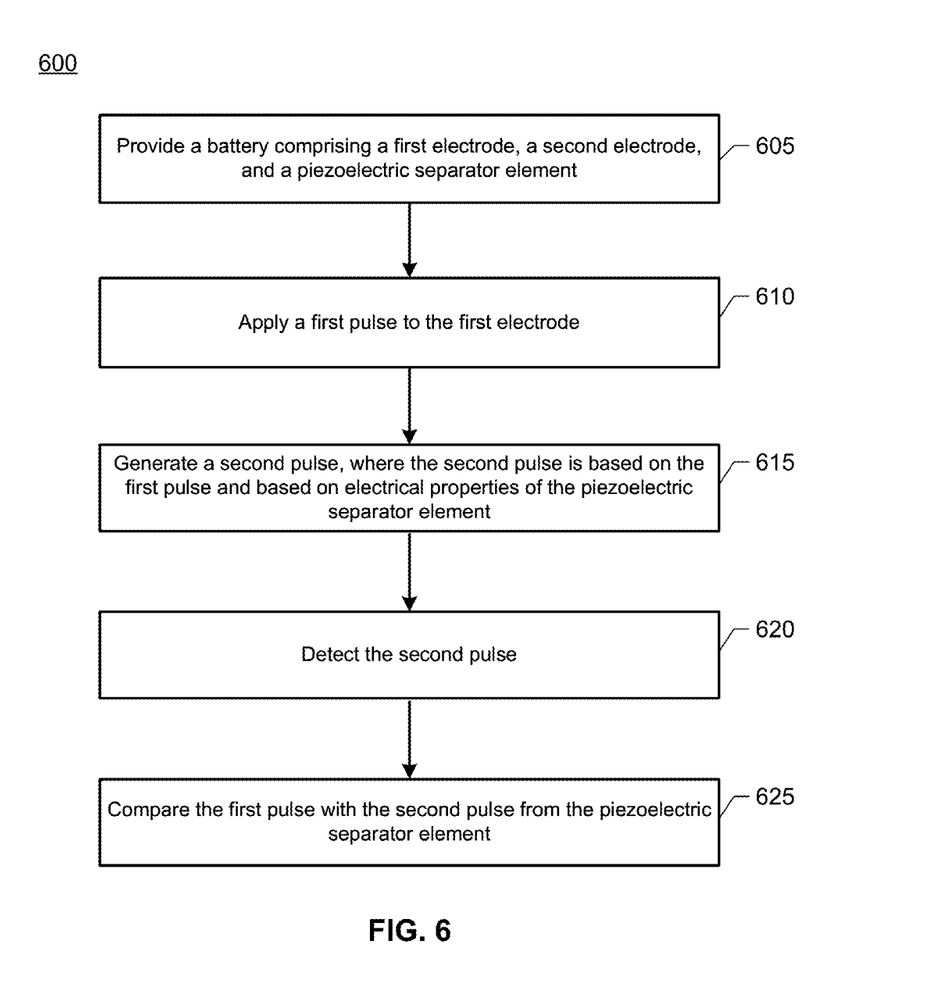
FIG. 6 shows a flowchart illustrating an example process, in accordance with various aspects of the subject technology.

FIG. 6 shows a flowchart illustrating an example process 600, in accordance with various aspects of the subject technology. The blocks of the process 600 do not need to be performed in the order shown. It is understood that the depicted order is an illustration of one or more example approaches, and are not meant to be limited to the specific order or hierarchy presented. The blocks can be rearranged, and/or two or more of the blocks can be performed simultaneously.

At block 605, a battery that includes a first electrode (e.g., 205 in FIG. 2), a second electrode (e.g., 210), and a piezoelectric separator element (e.g., 215) is provided. At block 610, a first pulse is applied to the first electrode. The first pulse may be generated by a pulse generator (e.g., 220). At block 615, a second pulse is generated. The second pulse is based on the first pulse and based on electrical properties of the piezoelectric separator element. At block 620, the second pulse is detected. The second pulse may be generated by the piezoelectric separator element relaxing and discharging stored mechanical energy. At block 625, the first pulse is compared with the second pulse from the piezoelectric separator. A result of the comparison may be utilized in determining whether dendrite has formed in the battery and determining to what degree dendrite has formed in the battery.

The description of the subject technology is provided to enable any person skilled in the art to practice the various aspects described herein. While the subject technology has been particularly described with reference to the various figures and aspects, it should be understood that these are for illustration purposes only and should not be taken as limiting the scope of the subject technology.

There may be many other ways to implement the subject technology. Various functions and elements described herein may be partitioned differently from those shown without departing from the scope of the subject technology. Various modifications to these aspects will be readily apparent to those skilled in the art, and generic principles defined herein may be applied to other aspects. Thus, many changes and modifications may be made to the subject technology, by one having ordinary skill in the art, without departing from the scope of the subject technology.

It is understood that the specific order or hierarchy of steps in the processes disclosed is an illustration of exemplifying approaches. Based upon design preferences, it is understood that the specific order or hierarchy of steps in the processes may be rearranged. Some of the steps may be performed simultaneously.

It is noted that dimensional aspects provided above are examples and that other values for the dimensions can be utilized in accordance with one or more implementations. Furthermore, the dimensional aspects provided above are generally nominal values. As would be appreciated by a person skilled in the art, each dimensional aspect has a tolerance associated with the dimensional aspect. Similarly, aspects related to distances between features also have associated tolerances.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

A reference to an element in the singular is not intended to mean "one and only one" unless specifically stated, but rather "one or more". The term "some" refers to one or more. Underlined and/or italicized headings and subheadings are used for convenience only, do not limit the subject technology, and are not referred to in connection with the interpretation of the description of the subject technology.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example or illustration". Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for". Furthermore, to the extent that the term "include", "have", or the like is used in the description or the claims, such term is intended to be inclusive in a manner similar to the term "comprise" as "comprise" is interpreted when employed as a transitional word in a claim.

Although the invention has been described with reference to the disclosed embodiments, those skilled in the art will readily appreciate that these are only illustrative of the invention. It should be understood that various modifications can be made without departing from the spirit of the invention. The invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description.

The invention claimed is:

1. An electrical device, comprising:
a pulse generator configured to generate a first pulse;
a battery, comprising:
  a first conductive electrode configured to receive the first pulse from the pulse generator;
  a second conductive electrode coupled to the first conductive electrode; and
  a dielectric separator element coupled to the first conductive electrode and the second conductive electrode and configured to provide a second pulse, wherein the second pulse is based on the first pulse and based on electrical properties of the dielectric separator element; and a controller coupled to the pulse generator and the dielectric separator element, wherein the controller is programmed to:

measure a capacitance within the battery at the dielectric separator element;

measure, over a period of time, an electric field in the battery based on the measured capacitance;

determine whether there is a change in the measured electric field over the period of time based on a comparison between the first pulse and the second pulse; and determine there exists an anomalous formation in the battery when the change in the measured electric field was determined over the period of time.

2. The electrical device of claim 1, wherein the controller is configured to compare the first pulse and the second pulse by comparing a shape, a slope, or an energy content of the first pulse and a shape, a slope, or an energy content of the second pulse.

3. The electrical device of claim 1, further comprising a delay component disposed between the pulse generator and the controller and configured to receive the first pulse and generate a third pulse, wherein:

the third pulse is a delayed version of the first pulse, a delay in the third pulse is based on a time constant of the dielectric separator element, and the controller is configured to compare the first pulse with the second pulse by comparing the third pulse with the second pulse.

4. The electrical device of claim 1, wherein:

the dielectric separator element is a piezoelectric separator element, the piezoelectric separator element is disposed between the first conductive electrode and the second conductive electrode, the controller is coupled to the first conductive electrode and the second conductive electrode, and the controller is configured to detect the second pulse using the first conductive electrode and the second conductive electrode.

5. The electrical device of claim 1, wherein the battery further comprises one or more bulking separator elements disposed between the first conductive electrode and the second conductive electrode.

6. The electrical device of claim 1, wherein:

the dielectric separator element is a piezoelectric separator element, and the electrical properties of the piezoelectric separator element depend on formation of dendrites in the piezoelectric separator element.

7. The electrical device of claim 1, wherein:

the dielectric separator element is a piezoelectric separator element, and in response to the first pulse, the piezoelectric separator element is configured to experience an electric field, deform mechanically, and store energy of the first pulse.

8. The electrical device of claim 1, wherein:

the dielectric separator element is a piezoelectric separator element, and when the first pulse ends, the piezoelectric separator element is configured to relax and generate the second pulse.

9. The electrical device of claim 1, wherein a polarity of the second pulse is reverse of a polarity of the first pulse.

10. The electrical device of claim 1, wherein the controller is configured to monitor the first pulse during a measurement cycle and to monitor the second pulse during the measurement cycle, wherein the measurement cycle is a fraction of a resonant frequency of the battery.

11. The electrical device of claim 1, wherein the anomalous formation represents a dendrite formation in the battery, and wherein the controller detects the anomalous formation when a shape, a slope, or an energy content of the first pulse is different from a shape, a slope, or an energy content of the second pulse.

12. The electrical device of claim 1, wherein the controller is further configured to regulate operation of the battery based at least in part on a result of comparing the first pulse and the second pulse.

13. The electrical device of claim 1, wherein the battery comprises a lithium-ion battery.

* * * * *